(12) United States Patent
Kim (10) Patent No.: US 8,358,160 B2
(45) Date of Patent: Jan. 22, 2013

(54) CLOCK SIGNAL GENERATION CIRCUIT

(75) Inventor: Kwan-Dong Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 9 days.

(21) Appl. No.: 13/017,270

(22) Filed: Jan. 31, 2011

(65) Prior Publication Data

US 2012/0153999 A1 Jun. 21, 2012

(30) Foreign Application Priority Data

Dec. 17, 2010 (KR) .................. 10-2010-0129883

(51) Int. Cl.
*H03L 7/06* (2006.01)

(52) U.S. Cl. ...................... 327/157; 327/148

(58) Field of Classification Search .................. None
See application file for complete search history.

(56) References Cited

U.S. PATENT DOCUMENTS

| | | | |
|---|---|---|---|
| 6,259,755 B1 * | 7/2001 | O'Sullivan et al. ............ 375/376 |
| 7,023,251 B2 * | 4/2006 | Starr .............................. 327/157 |
| 7,358,827 B2 | 4/2008 | Sohn et al. | |
| 7,365,581 B2 | 4/2008 | Shi et al. | |
| 7,375,593 B2 * | 5/2008 | Self ................................. 331/16 |
| 7,728,675 B1 * | 6/2010 | Kennedy et al. ................ 331/16 |
| 7,973,606 B2 * | 7/2011 | Kim et al. ....................... 331/12 |
| 8,063,677 B2 * | 11/2011 | Kim ............................... 327/156 |
| 8,063,707 B2 * | 11/2011 | Wang ............................. 331/11 |
| 2007/0026814 A1 * | 2/2007 | Gierkink ......................... 455/73 |
| 2007/0229129 A1 * | 10/2007 | Nakagawa .................... 327/156 |
| 2008/0061888 A1 * | 3/2008 | Liu ................................. 331/11 |
| 2009/0289726 A1 | 11/2009 | Peng et al. | |

FOREIGN PATENT DOCUMENTS

| | | |
|---|---|---|
| KR | 1020090070793 | 10/2009 |
| KR | 1020090105052 | 10/2009 |

* cited by examiner

*Primary Examiner* — Cassandra Cox (74) *Attorney, Agent, or Firm* — IP & T Group LLP (57) ABSTRACT

A clock signal generation circuit includes a clock inversion unit inverting a reference clock signal and an internal clock signal to generate an inverted reference clock signal and an inverted internal clock signal, a first clock detection unit comparing the reference clock signal with the internal clock signal to output a first detection signal, a second clock detection unit comparing the inverted reference clock signal with the inverted internal clock signal to output a second detection signal, first and second charge pump units generating charge current or discharge current in response to the first second detection signals, respectively, a loop filter unit producing a control voltage signal having a voltage level corresponding to the charge currents or discharge currents, and an internal clock signal output unit producing the internal clock signal according to the control voltage signal.

15 Claims, 10 Drawing Sheets

CLOCK SIGNAL GENERATION CIRCUIT

CROSS-REFERENCE TO RELATED APPLICATIONS

The present invention claims priority of Korean patent application number 10-2010-0129883, filed on Dec. 17, 2010, which is incorporated by reference in its entirety.

BACKGROUND OF THE INVENTION

Exemplary embodiments of the present invention relate to a semiconductor device, and more particularly, to a clock signal generation circuit.

Generally, a semiconductor device produces internal clock signals using an external clock signal and uses these internal clock signals as reference clock signals for synchronization with various operation timings. Accordingly, a clock signal generation circuit for generating the internal clock signals is provided in the semiconductor device. A typical clock generation circuit is a phase locked loop (PLL) or a delay locked loop (DLL).

Control methods for producing the internal clock signals using the PLL or the DLL may be classified as an analog-based method or a digital-based method. The analog-based method uses a voltage controlled oscillator (VCO), while the digital-based method uses a voltage controlled delay line (VCLD).

Figure 1:
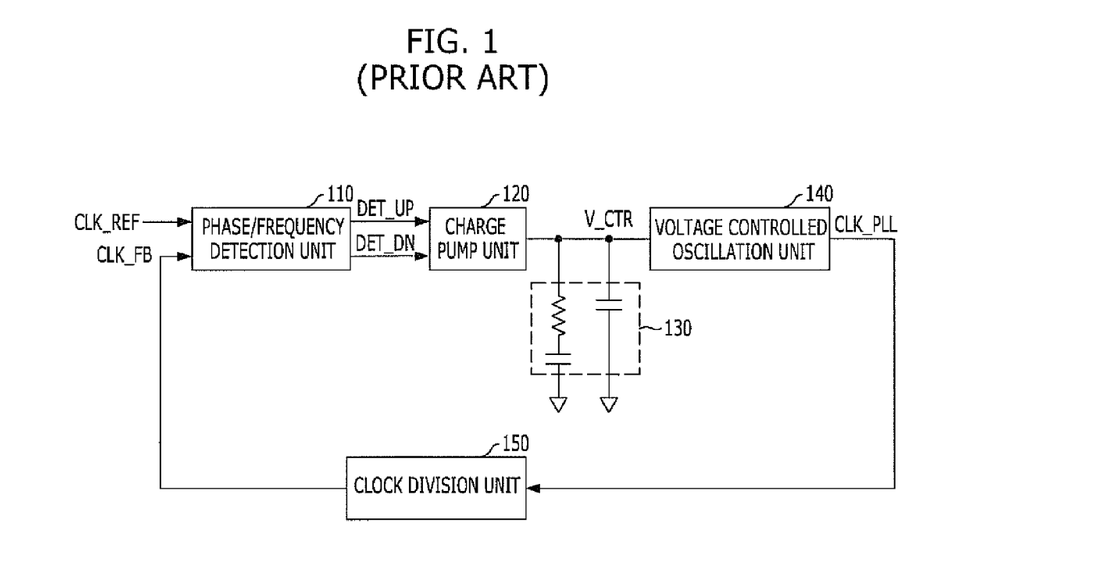
FIG. 1 is a block diagram illustrating a conventional phase locked loop (PLL).

FIG. 1 is a block diagram illustrating a conventional PLL.

Referring to FIG. 1, the PLL includes a phase/frequency detection unit 110, a charge pump unit 120, a loop filter unit 130, a voltage controlled oscillation unit 140, and a clock division unit 150.

The phase/frequency detection unit 110 produces an up-detection signal DET_UP and a down-detection signal DET_DN which correspond to a phase/frequency difference between a reference clock signal CLK_REF and a feedback clock signal CLK_FB. The charge pump unit 120 generates charge current or discharge current in response to the up-detection signal DET_UP and the down-detection signal DET_DN. The loop filter unit 130 produces an oscillation control voltage signal V_CTR which has a voltage level corresponding to the charge current or discharge current generated by the charge pump unit 120. The voltage controlled oscillation unit 140 produces a PLL clock signal CLK_PLL which has a frequency corresponding to the oscillation control voltage signal V_CTR. The clock division unit 150 divides the PLL clock signal CLK_PLL to generate the feedback clock signal CLK_FB. Finally, the feedback clock signal CLK_FB is fed back to the phase/frequency detection unit 110.

Figure 2:
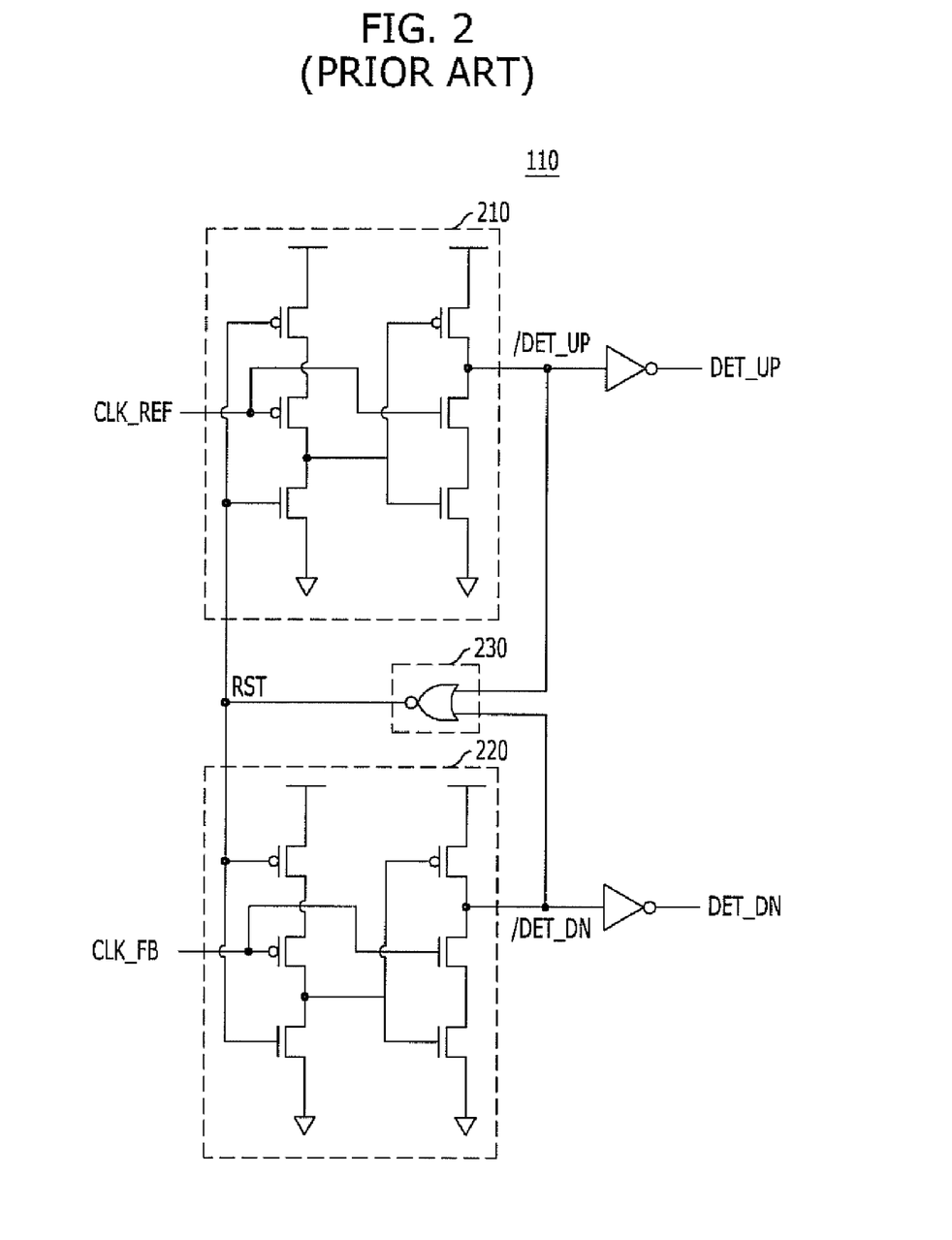
FIG. 2 is a circuit diagram illustrating a phase/frequency detection unit of FIG. 1.

FIG. 2 is a circuit diagram illustrating the phase/frequency detection unit 110 of FIG. 1.

Referring to FIG. 2, the phase/frequency detection unit 110 includes an up-detection signal generation unit 210, a down-detection signal generation unit 220, and a reset unit 230.

The up-detection signal generation unit 210 generates the up-detection signal DET_UP in response to the reference clock signal CLK_REF and a reset signal RST. The down-detection signal generation unit 220 generates the down-detection signal DET_DN in response to the feedback clock signal CLK_FB and the reset control signal RST. The reset unit 230 generates the reset control signal RST in response to complementary signals of the up-detection signal DET_UP and the down-detection signal DET_DN.

Figure 3:
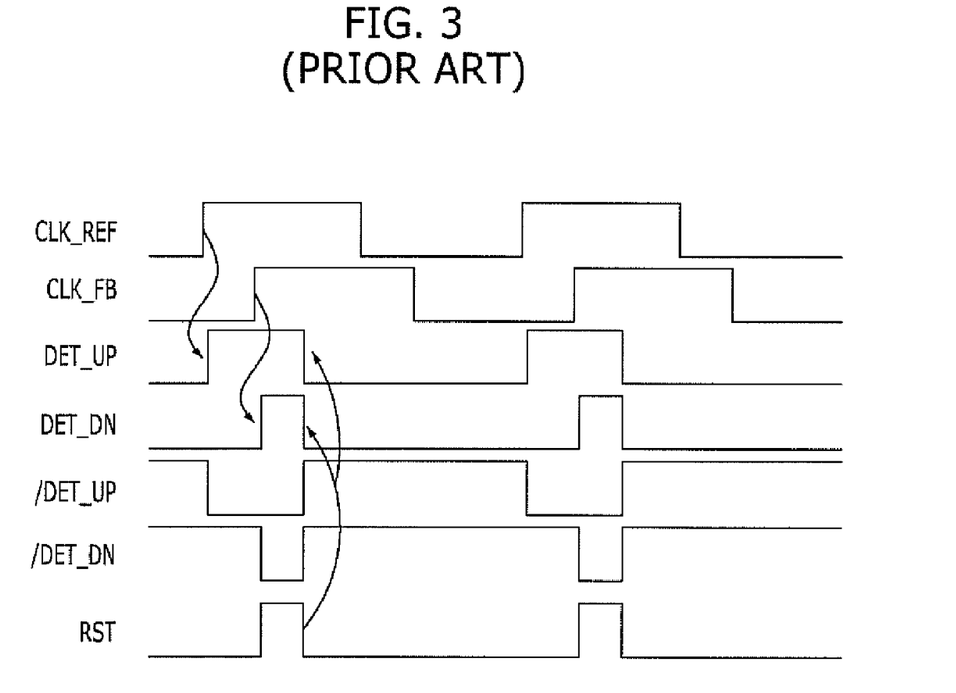
FIG. 3 is a waveform diagram illustrating an operation of the phase/frequency detection unit of FIG. 2.

FIG. 3 is a waveform diagram illustrating an operation of the phase/frequency detection unit 110 of FIG. 2.

Here, it is assumed that the reference clock signal CLK_REF has a frequency substantially the same as that of the feedback clock signal CLK_FB while the reference clock signal CLK_REF has a phase different from that of the feedback clock signal CLK_FB.

Referring to FIGS. 2 and 3, the up-detection signal DET_UP transitions to a logic high level in response to a rising edge of the reference clock signal CLK_REF, and the down-detection signal DET_DN transitions to a logic high level in response to a rising edge of the feedback clock signal CLK_FB. The reset control signal RST has a high logic level when complementary signals of the up-detection signal DET_UP and the down-detection signal DET_DN are both at a logic low level. Further, both the up-detection signal DET_UP and the down-detection signal DET_DN transition to a logic low level in response to a falling edge of the reset control signal RST. Therefore, the up-detection signal DET_UP and the down-detection signal DET_DN have different pulse widths according to a phase difference between the reference clock signal CLK_REF and the feedback clock signal CLK_FB.

Referring back to FIG. 1, the up-detection signal DET_UP and the down-detection signal DET_DN are transferred to the charge pump unit 120, and the charge pump unit 120 generates the charge current or the discharge current for a duration corresponding to a difference between the pulse width of the up-detection signal DET_UP and the pulse width of the down-detection signal DET_DN. Subsequently, the loop filter unit 130 produces the oscillation control voltage signal V_CTR which has a voltage level corresponding to the charge current or discharge current, and the voltage controlled oscillation unit 140 produces the PLL clock signal CLK_PLL which has a frequency corresponding to the oscillation control voltage signal V_CTR. Finally, the feedback clock signal CLK_FB is fed back to the phase/frequency detection unit 110 through the clock division unit 150.

Through repeated detections, the PLL outputs the PLL clock signal CLK_PLL which is synchronized with the reference clock signal CLK_REF. The process of synchronizing the reference clock signal CLK_REF and the PLL clock signal CLK_PLL is called a "phase/frequency locking" operation.

As described above, the phase/frequency locking operation of the conventional PLL is performed such that the charge pump unit 120 operates for a duration according to the pulse widths of the up-detection signal DET_UP and the down-detection signal DET_DN.

Meanwhile, in order for the PLL to output the PLL clock signal CLK_PLL having a desired frequency, a certain amount of time is required to perform the phase/frequency locking operation. In general, this amount of time is called a "locking" time. That is, the PLL is designed to produce the desired PLL clock signal CLK_PLL after the locking time elapses. After such desired PLL clock signal CLK_PLL is generated, a semiconductor device may use the PLL clock signal CLK_PLL as an internal clock signal. Accordingly, to order to secure a faster circuit operation of the semiconductor device, decreasing the locking time of the PLL is desired.

SUMMARY OF THE INVENTION

Exemplary embodiments of the present invention are directed to a clock signal generation circuit capable of performing a faster locking operation.

Exemplary embodiments of the present invention are also directed to a clock signal generation circuit which generates a detection signal in response to all activation edges of clock signals used to detect phase/frequency, and performs a phase/frequency locking operation using this detection signal. Accordingly, the clock signal generation circuit may decrease/reduce a locking time thereof.

In accordance with an exemplary embodiment of the present invention, a clock signal generation circuit includes a clock inversion unit configured to invert a reference clock signal and an internal clock signal to generate an inverted reference clock signal and an inverted internal clock signal, a first clock detection unit configured to compare the reference clock signal with the internal clock signal to output a first detection signal, a second clock detection unit configured to compare the inverted reference clock signal with the inverted internal clock signal to output a second detection signal, first and second charge pump units configured to generate charge current or discharge current in response to the first detection signal and the second detection signal, respectively, a loop filter unit configured to produce a control voltage signal having a voltage level corresponding to the charge currents or discharge currents, and an internal clock signal output unit configured to produce the internal clock signal according to the control voltage signal.

In accordance with another exemplary embodiment of the present invention, a clock signal generation circuit includes a clock inversion unit configured to invert a reference clock signal and an internal clock signal to generate an inverted reference clock signal and an inverted internal clock signal, a first clock detection unit configured to compare the reference clock signal with the internal clock signal to output a first detection signal, a second clock detection unit configured to compare the inverted reference clock signal with the inverted internal clock signal to output a second detection signal, a first charge pump unit configured to generate a first control voltage signal in response to the first detection signal, a second charge pump unit configured to generate a second control voltage signal in response to the second detection signal and the first control voltage signal, and an internal clock signal output unit configured to produce the internal clock signal according to the second control voltage signal.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
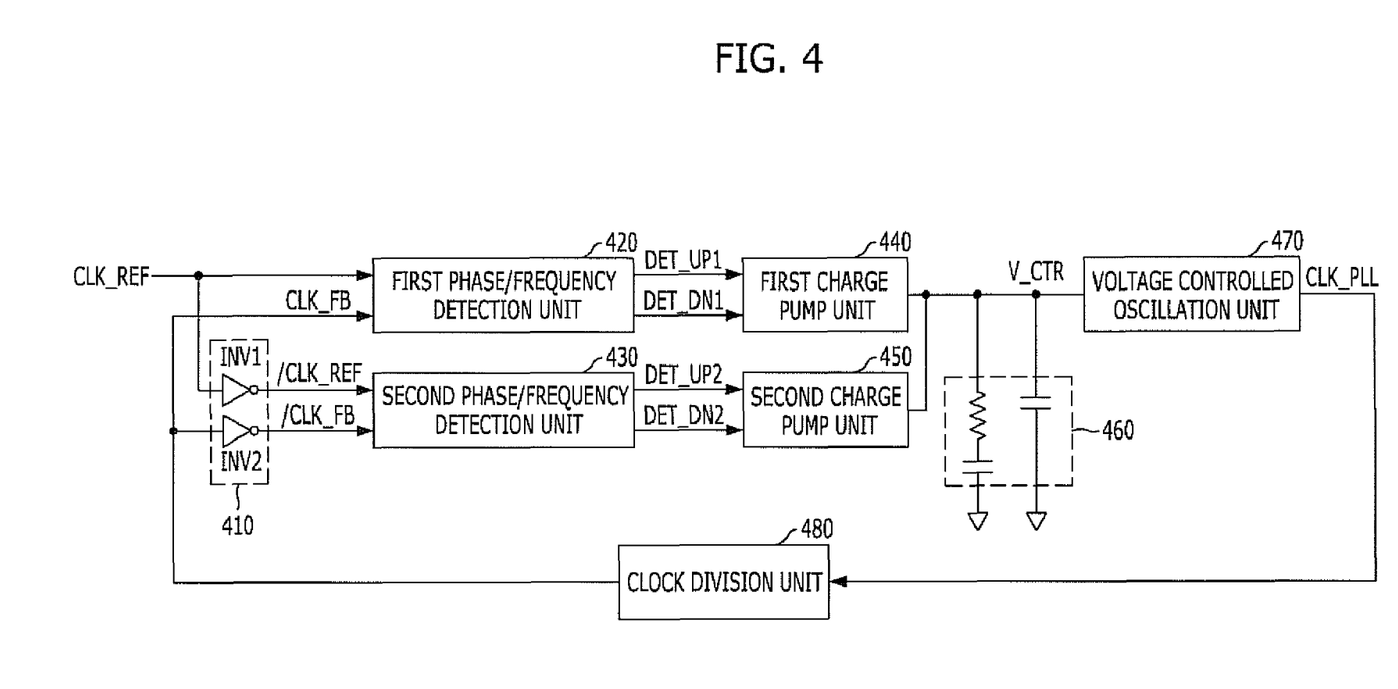
FIG. 4 is a block diagram illustrating a phase locked loop (PLL) version of an internal clock signal generation circuit in accordance with an exemplary embodiment of the present invention.

FIG. 4 is a block diagram illustrating a phase locked loop (PLL) version of an internal clock signal generation circuit in accordance with an exemplary embodiment of the present invention.

Referring to FIG. 4, the PLL includes a clock inversion unit 410, first and second phase/frequency detection units 420 and 430, first and second charge pump units 440 and 450, a loop filter unit 460, a voltage controlled oscillation unit 470, and a clock division unit 480.

The clock inversion unit 410 is configured to invert a reference clock signal CLK_REF and a feedback clock signal CLK_FB to generate an inverted reference clock signal /CLK_REF and an inverted feedback clock signal /CLK_FB, respectively. The clock inversion unit 410 may include first and second inverters INV1 and INV2. The first phase/frequency detection unit 420 is configured to compare a phase/frequency of the reference clock signal CLK_REF with that of the feedback clock signal CLK_FB to output a first up-detection signal DET_UP1 and a first down-detection signal DET_DN1. The second phase/frequency detection unit 430 is configured to compare a phase/frequency of the inverted reference clock signal /CLK_REF with that of the inverted feedback clock signal /CLK_FB to output a second up-detection signal DET_UP2 and a second down-detection signal DET_DN2.

The first charge pump unit 440 is configured to generate charge current or discharge current in response to the first up-detection signal DET_UP1 and the first down-detection signal DET_DN1. The second charge pump unit 450 is configured to generate charge current or discharge current in response to the second up-detection signal DET_UP2 and the second down-detection signal DET_DN2. The loop filter unit 460 is configured to produce an oscillation control voltage signal V_CTR which has a voltage level corresponding to the charge currents or discharge currents generated by the first and second charge pump units 440 and 450. The voltage controlled oscillation unit 470 is configured to produce a PLL clock signal CLK_PLL which has a frequency corresponding to the oscillation control voltage signal V_CTR. The clock division unit 480 is configured to divide the PLL clock signal CLK_PLL to generate the feedback clock signal CLK_FB. Finally, the feedback clock signal CLK_FB is fed back to the clock inversion unit 410 and the first phase/frequency detection unit 420.

Through repeated detections, the PLL outputs the PLL clock signal CLK_PLL having a desired frequency and phase and synchronized with the reference clock signal CLK_REF. The process of synchronizing the reference clock signal CLK_REF and the PLL clock signal CLK_PLL is called a "phase/frequency locking" operation.

As shown, the first phase/frequency detection unit 420, the first charge pump unit 440, the loop filter unit 460, the voltage controlled oscillation unit 470, and the clock division unit 480 form a loop. Further, the clock inversion unit 410, the second phase/frequency detection unit 430, the second charge pump unit 450, the loop filter unit 460, the voltage controlled oscillation unit 470, and the clock division unit 480 form another loop. Accordingly, the PLL in accordance with this exemplary embodiment of the present invention can perform a faster locking operation.

For reference, the clock inversion unit 410, the second phase/frequency detection unit 430, and the second charge pump unit 450 may be disabled after the phase/frequency locking operation is finished. Accordingly, current consumption after the phase/frequency locking operation may be decreased/minimized.

Figure 5:
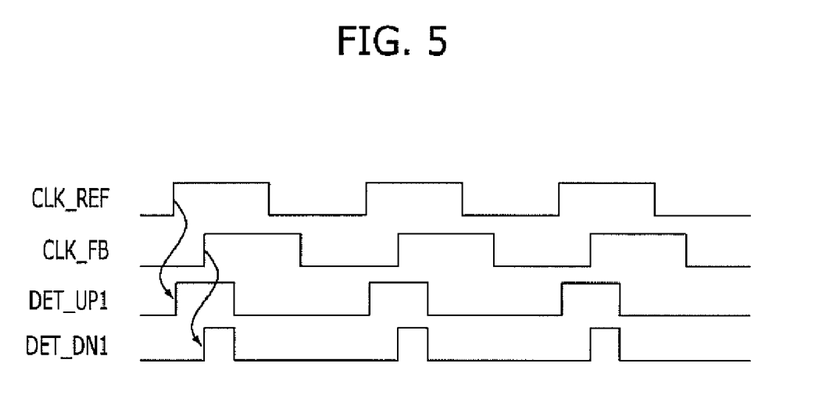
FIG. 5 is a waveform diagram illustrating an operation of a first phase/frequency detection unit of FIG. 4.

FIG. 5 is a waveform diagram illustrating an operation of the first phase/frequency detection unit 420 of FIG. 4. Here, it is assumed that the reference clock signal CLK_REF has a frequency substantially the same as that of the feedback clock signal CLK_FB while the reference clock signal CLK_REF has a phase different from that of the feedback clock signal CLK_FB.

Referring to FIG. 5, the first up-detection signal DET_UP1 transitions to a logic high level in response to a rising edge of the reference clock signal CLK_REF, and the first down-detection signal DET_DN1 transitions to a logic high level in response to a rising edge of the feedback clock signal CLK_FB. Therefore, the first up-detection signal DET_UP1 and the first down-detection signal DET_DN1 have different pulse widths according to a phase difference between the reference clock signal CLK_REF and the feedback clock signal CLK_FB.

Figure 6:
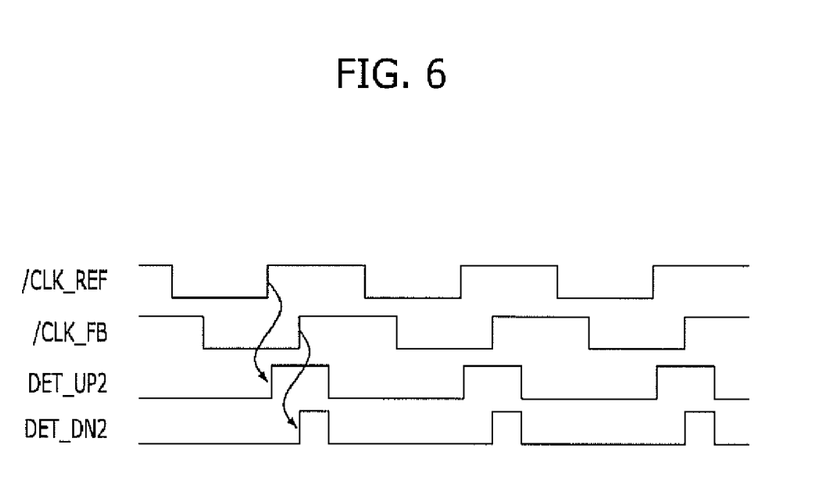
FIG. 6 is a waveform diagram illustrating an operation of a second phase/frequency detection unit of FIG. 4.

FIG. 6 is a waveform diagram illustrating an operation of the second phase/frequency detection unit 430 of FIG. 4.

Referring to FIG. 6, the second up-detection signal DET_UP2 transitions to a logic high level in response to a rising edge of the inverted reference clock signal/CLK_REF, and the second down-detection signal DET_DN2 transitions to a logic high level in response to a rising edge of the inverted feedback clock signal/CLK_FB. Therefore, the second up-detection signal DET_UP2 and the second down-detection signal DET_DN2 have different pulse widths according to a phase difference between the inverted reference clock signal/CLK_REF and the inverted feedback clock signal/CLK_FB.

As shown in FIGS. 5 and 6, the internal clock signal generation circuit in accordance with this exemplary embodiment of the present invention changes logic levels of the first up-detection signal DET_UP1 and the first down-detection signal DET_DN1 in response to the rising edges of the reference clock signal CLK_REF and the feedback clock signal CLK_FB, respectively. Further, the internal clock signal generation circuit changes logic levels of the second up-detection signal DET_UP2 and the second down-detection signal DET_DN2 in response to the rising edges of the inverted reference clock signal/CLK_REF and the inverted feedback clock signal/CLK_FB, respectively.

In other words, the internal clock signal generation circuit in accordance with this exemplary embodiment of the present invention generates the first up-detection signal DET_UP1 and the first down-detection signal DET_DN1 according to the rising edges of the reference clock signal CLK_REF and the feedback clock signal CLK_FB, respectively. Further, the internal clock signal generation circuit generates the second up-detection signal DET_UP2 and the second down-detection signal DET_DN2 according to falling edges of the reference clock signal CLK_REF and the feedback clock signal CLK_FB, respectively. As a result, the PLL version of the internal clock signal generation circuit in accordance with this exemplary embodiment of the present invention may perform a phase/frequency locking operation at the falling edges of the reference clock signal CLK_REF and the feedback clock signal CLK_FB, as well as, at the rising edges of the reference clock signal CLK_REF and the feedback clock signal CLK_FB. Accordingly, the PLL may secure a phase-locked loop in half the time it takes the conventional PLL.

In sum, the PLL in accordance with an exemplary embodiment of the present invention operates in response to rising and falling edges of each clock signal, while the conventional PLL only operates in response to a rising edge of each clock signal. Thus, the PLL in accordance with an exemplary embodiment of the present invention may decrease/reduce a locking time to half that of the conventional PLL. Here, a reduction of the locking time means that the PLL may rapidly generate the PLL clock signal CLK_PLL having a desired phase/frequency. Accordingly, an operation timing of a circuit which uses the PLL clock signal CLK_PLL may be improved.

Figure 7:
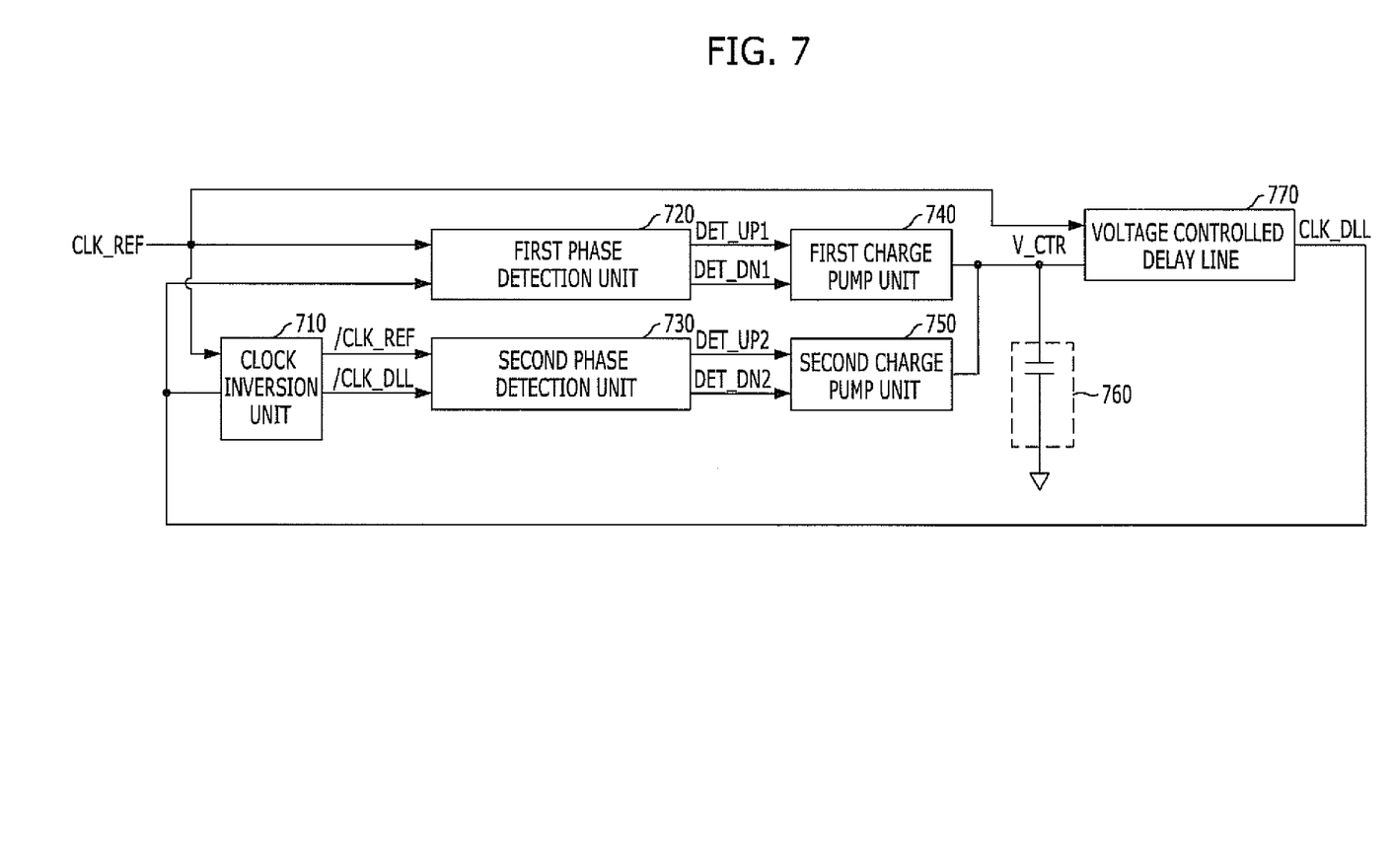
FIG. 7 is a block diagram illustrating a delay locked loop (DLL) version of an internal clock signal generation circuit in accordance with an exemplary embodiment of the present invention.

FIG. 7 is a block diagram illustrating a delay locked loop (DLL) version of an internal clock signal generation circuit in accordance with an exemplary embodiment of the present invention.

Referring to FIG. 7, the DLL includes a clock inversion unit 710, first and second phase detection units 720 and 730, first and second charge pump units 740 and 750, a loop filter unit 760, and a voltage controlled delay line 770.

The clock inversion unit 710 is configured to invert a reference clock signal CLK_REF and a DLL clock signal CLK_DLL to generate an inverted reference clock signal/CLK_REF and an inverted DLL clock signal/CLK_DLL, respectively. The first phase detection unit 720 is configured to compare a phase of the reference clock signal CLK_REF with that of the DLL clock signal CLK_DLL to output a first up-detection signal DET_UP1 and a first down-detection signal DET_DN1. The second phase detection unit 730 is configured to compare a phase of the inverted reference clock signal/CLK_REF with that of the inverted DLL clock signal/CLK_DLL to output a second up-detection signal DET_UP2 and a second down-detection signal DET_DN2. It should be understood that the first and second phase detection units 720 and 730 may operate in the same manner as the first and second phase/frequency detection units 420 and 430, respectively, set forth above with reference to FIGS. 5 and 6.

The first charge pump unit 740 is configured to generate charge current or discharge current in response to the first up-detection signal DET_UP1 and the first down-detection signal DET_DN1. The second charge pump unit 750 is configured to generate charge current or discharge current in response to the second up-detection signal DET_UP2 and the second down-detection signal DET_DN2. The loop filter unit 760 is configured to produce an oscillation control voltage signal V_CTR which has a voltage level corresponding to the charge currents or discharge currents generated by the first and second charge pump units 740 and 750. The voltage controlled delay line 770 produces the DLL clock signal CLK_DLL by delaying the reference clock signal CLK_REF by a delay amount corresponding to the voltage level of the oscillation control voltage signal V_CTR. Finally, the DLL clock signal CLK_DLL is fed back to the clock inversion unit 710 and the first phase detection unit 720. Through repeated detections, the DLL outputs the DLL clock signal CLK_DLL having a desired phase.

As shown, the first phase detection unit 720, the first charge pump unit 740, the loop filter unit 760, and the voltage controlled delay line 770 form a loop. Further, the clock inversion unit 710, the second phase detection unit 730, the second charge pump unit 750, the loop filter unit 760, and the voltage controlled delay line 770 form another loop. Accordingly, the DLL in accordance with this exemplary embodiment of the present invention can perform a faster locking operation.

Figure 8:
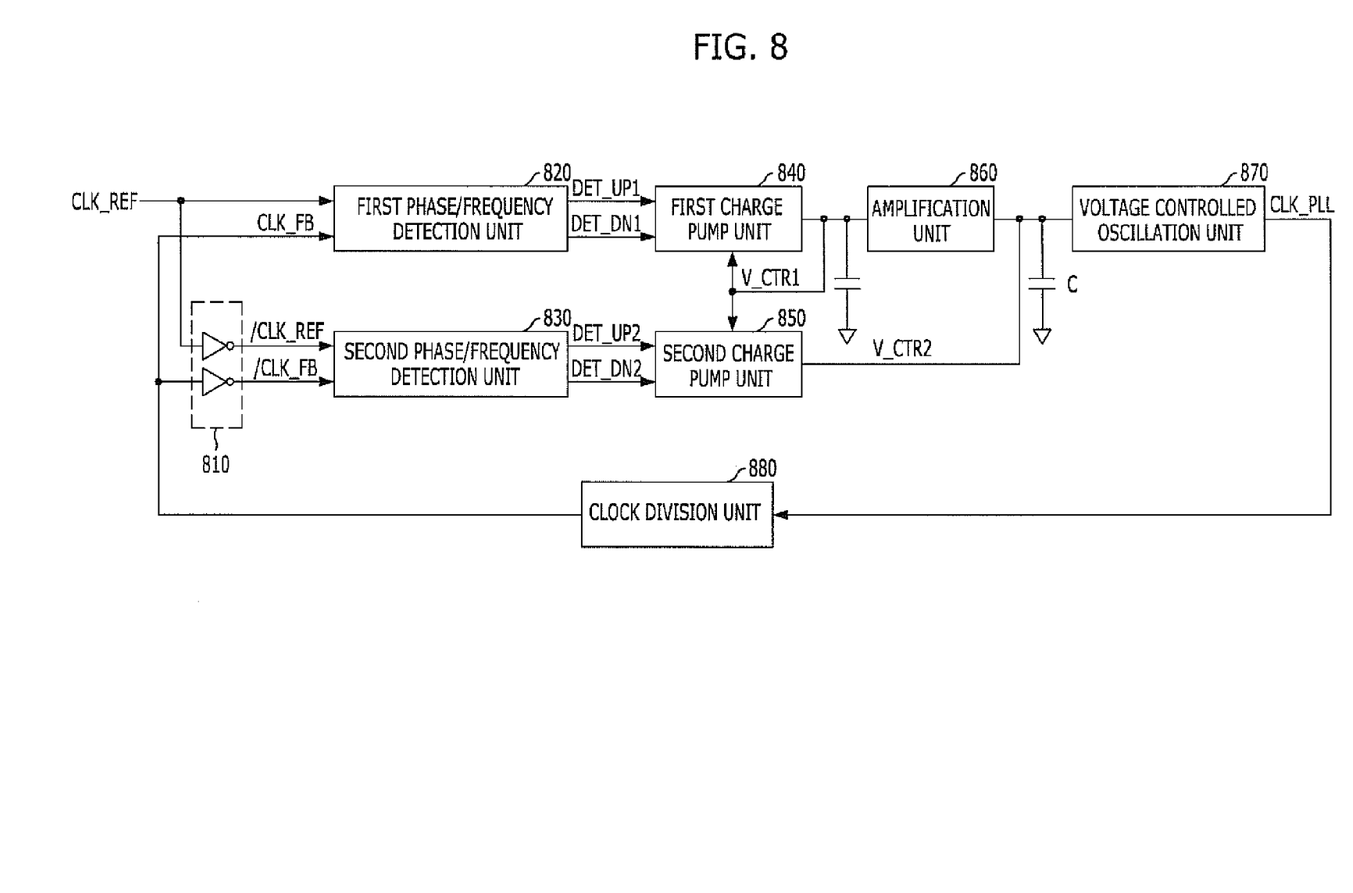
FIG. 8 is a block diagram illustrating a phase locked loop (PLL) in accordance with another exemplary embodiment of the present invention.

FIG. 8 is a block diagram illustrating a phase locked loop (PLL) in accordance with another exemplary embodiment of the present invention.

Referring to FIG. 8, the PLL in accordance with another exemplary embodiment of the present invention includes a clock inversion unit 810, first and second phase/frequency detection units 820 and 830, first and second charge pump units 840 and 850, an amplification unit 860, a voltage controlled oscillation unit 870, and a clock division unit 880. Here, the clock inversion unit 810, the first and second phase/frequency detection units 820 and 830, the voltage controlled oscillation unit 870, and the clock division unit 880 have substantially the same configurations and operations as commonly named elements of the PLL of FIG. 4. However, the first and second charge pump units 840 and 850 and the amplification unit 860 are different from those of the PLL of FIG. 4.

As shown, the first phase/frequency detection unit 820, the first charge pump unit 840, the amplification unit 860, the voltage controlled oscillation unit 870, and the clock division unit 880 form a loop. Further, the clock inversion unit 810, the second phase/frequency detection unit 830, the second charge pump unit 850, the voltage controlled oscillation unit 870, and the clock division unit 880 form another loop. Accordingly, the PLL in accordance with this exemplary embodiment of the present invention can perform a faster locking operation.

Figure 9:
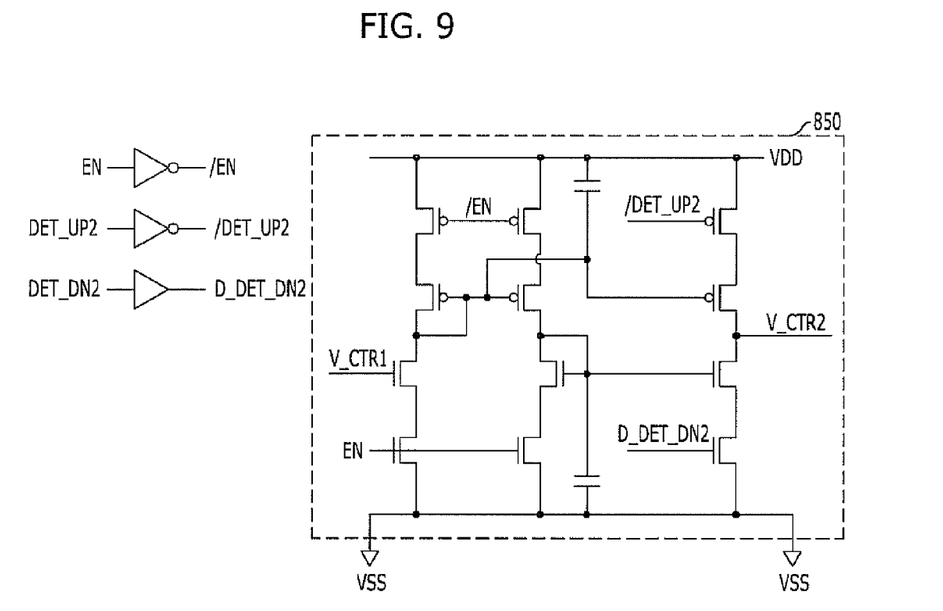
FIG. 9 is a circuit diagram illustrating first and second charge pump units of FIG. 8.

FIG. 9 is a circuit diagram illustrating the second charge pump unit 850 of FIG. 8.

Hereinafter, for convenience, only the second charge pump unit 850 is explained in further detail. From the description of the second charge pump unit 850, it should be understood how the first charge pump unit 840 is configured and operates.

Referring to FIGS. 8 and 9, the second charge pump unit 850 performs a charge pumping operation in response to an enable signal EN. Further, the second charge pump unit 850 receives a first oscillation control voltage signal V_CTR1 generated from the first charge pump unit 840 as a bias voltage. Moreover, the second charge pump unit 850 is configured to output charge current or discharge current to a node of the second oscillation control voltage signal V_CTR2 in response to a second up-detection signal DET_UP2 and a second down-detection signal DET_DN2. For example, the second charge pump unit 850 may include MOS transistors between a power supply voltage VDD and a ground supply voltage VSS that are activated or deactivated in response to an inverted second up-detection signal/DET_UP2, which is generated by inverting the second up-detection signal DET_UP2, and a buffered second down-detection signal D_DET_DN2, which is generated by buffering the second down-detection signal DET_DN2. The charge current or discharge current outputted from the second charge pump unit 850 and the charges of a capacitor C together generate the second oscillation control voltage signal V_CTR2. In other words, the capacitor C acts as a voltage generator for generating the second oscillation control voltage signal V_CTR2. For reference, the first oscillation control voltage signal V_CTR1 is configured to control pull-up drivability and pull-down drivability of the second oscillation control voltage signal V_CTR2.

Meanwhile, the first charge pump unit 840 has a configuration substantially the same as that of the second charge pump unit 850 of FIG. 9. In detail, the first charge pump unit 840 receives a first up-detection signal DET_UP1 and a first down-detection signal DET_DN1, instead of the second up-detection signal DET_UP2 and the second down-detection signal DET_DN2, to generate the first oscillation control voltage signal V_CTR1 instead of the second oscillation control voltage signal V_CTR2. The first charge pump unit 840 also receives the first oscillation control voltage signal V_CTR1 as a bias voltage.

Figure 10:
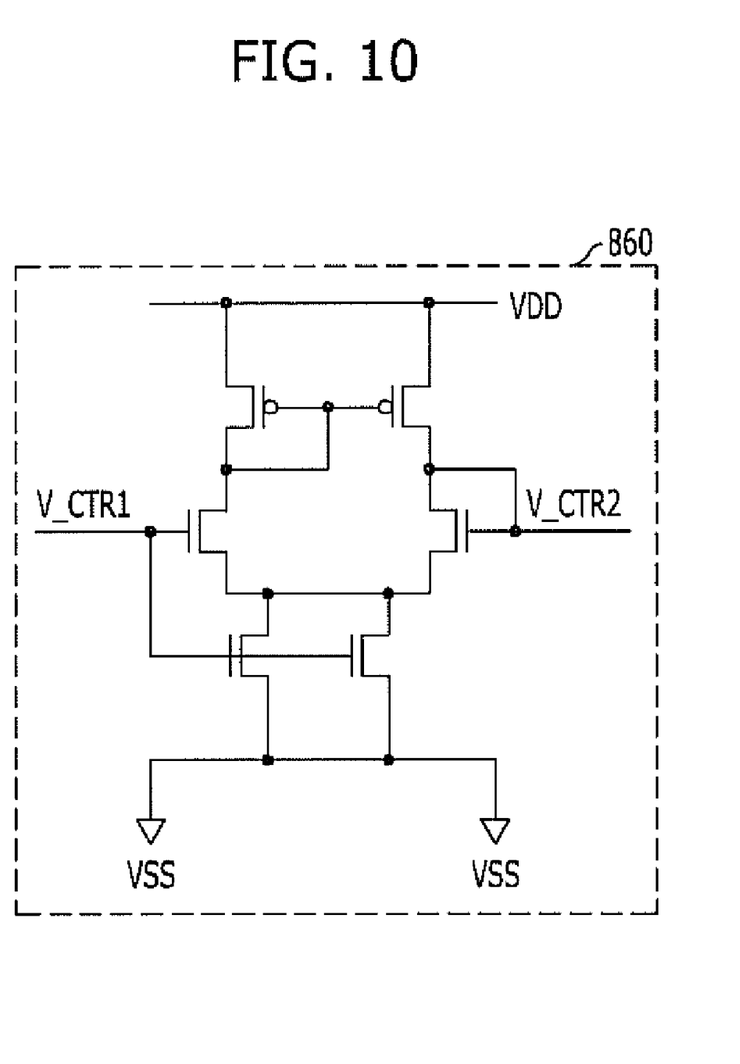
FIG. 10 is a circuit diagram illustrating an amplification unit of FIG. 8.

FIG. 10 is a circuit diagram illustrating the amplification unit 860 of FIG. 8.

Referring to FIG. 10, the amplification unit 860 buffers the first oscillation control voltage signal V_CTR1 to output the second oscillation control voltage signal V_CTR2 having a voltage level substantially the same as that of the first oscillation control voltage signal V_CTR1. Here, the amplification unit 860 may be implemented with a unit gain buffer.

The PLL of FIG. 8, which includes the circuitry shown in FIGS. 9 and 10, generates the second up-detection and down-detection signals DET_UP2 and DET_DN2 transitioning in response to the falling edges of the reference clock signal CLK_REF and the feedback clock signal CLK_FB, as well as the first up-detection and down-detection signals DET_UP1 and DET_DN1 transitioning in response to the rising edges of the reference clock signal CLK_REF and the feedback clock signal CLK_FB. Further, the PLL performs a locking operation in response to the first up-detection and down-detection signals DET_UP1 and DET_DN1 and the second up-detection and down-detection signals DET_UP2 and DET_DN2. As a result, the PLL performs the locking operation in response to both rising and falling edges of the reference clock signal CLK_REF and the feedback clock signal CLK_FB. Thus, the PLL in accordance with this exemplary embodiment of the present invention may decrease/reduce a time taken to complete the locking operation.

Figure 11:
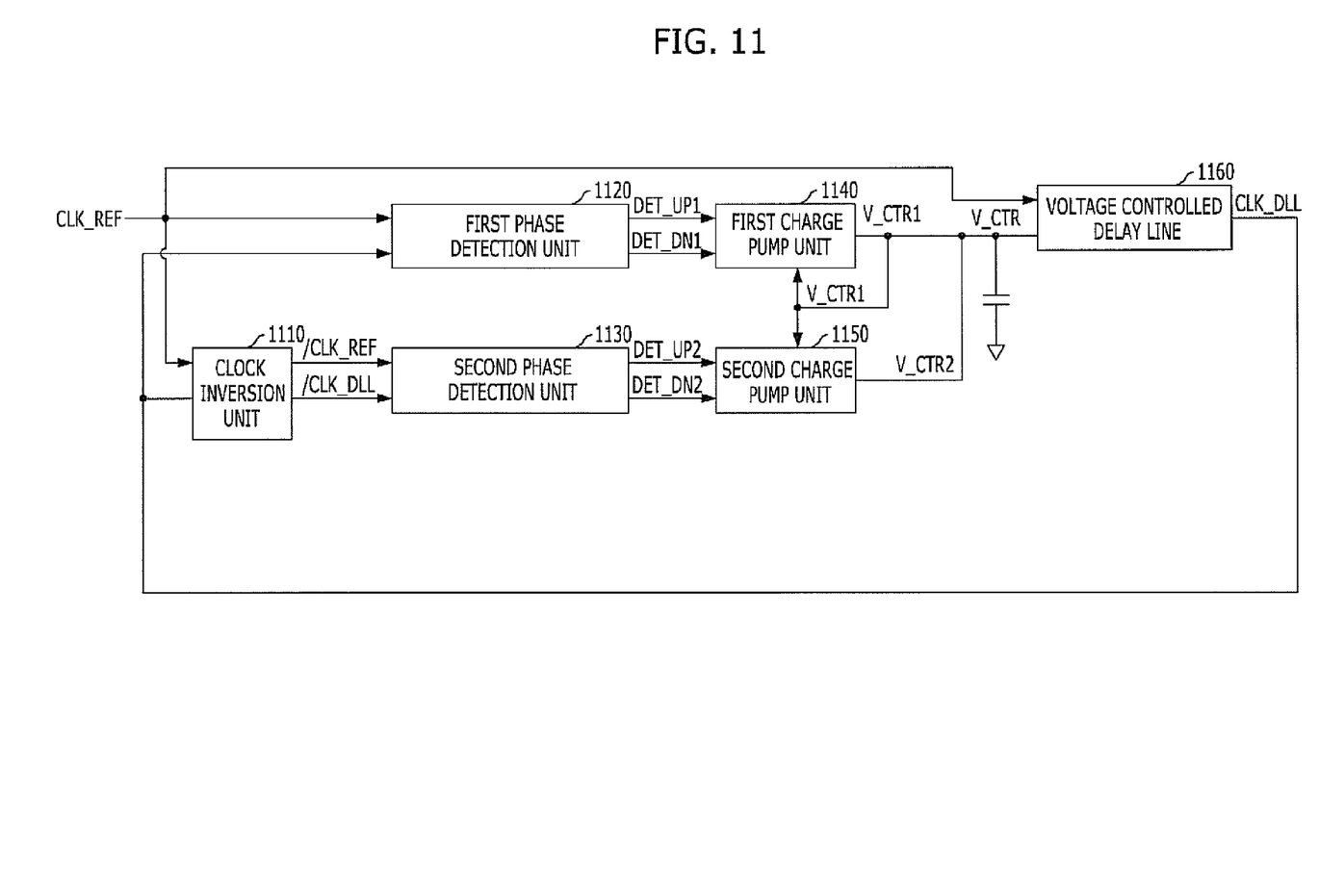
FIG. 11 is a block diagram illustrating a delay locked loop (DLL) in accordance with another exemplary embodiment of the present invention.

FIG. 11 is a block diagram illustrating a delay locked loop (DLL) in accordance with another exemplary embodiment of the present invention.

Referring to FIG. 11, the DLL includes a clock inversion unit 1110, first and second phase detection units 1120 and 1130, first and second charge pump units 1140 and 1150, and a voltage controlled delay line 1160. Here, the clock inversion unit 1110, the first and second phase detection units 1120 and 1130, and the voltage controlled delay line 1160 have the same configurations and operations as commonly named elements shown in FIG. 7. Further, the first and second charge pump units 1140 and 1150 have the same configurations and operations as commonly named elements shown in FIG. 8.

As shown, the first phase detection unit 1120, the first charge pump unit 1140, and the voltage controlled delay line 1160 form a loop. Further, the clock inversion unit 1110, the second phase detection unit 1130, the second charge pump unit 1150, and the voltage controlled delay line 1160 form another loop. As a result, the DLL performs a locking operation in response to both rising and falling edges of a reference clock signal CLK_REF and a feedback clock signal CLK_FB. Accordingly, the DLL in accordance with this exemplary embodiment of the present invention can perform a locking operation in half the time it takes the conventional DLL.

As mentioned above, the clock generation circuit according to the invention performs a phase/frequency locking operation using a detection signal which is generated in response to all transitions (i.e., rising and falling edges) of clock signals used to detect phase/frequency. Accordingly, the clock signal generation circuit of the present invention may decrease/reduce a locking time taken to generate an internal clock signal having a desired phase/frequency. Accordingly, an operation timing of a circuit which uses the internal clock signal may be improved.

While the invention has been described with respect to the particular embodiments, it will be apparent to those skilled in the art that various changes and modifications may be made without departing from the spirit and scope of the invention as defined in the following claims. For example, positions and types (e.g., NMOS, PMOS, etc.) of the transistors and the logic gates can be changed based on the polarity of the input and output signals.

While the kind of logic gates and constructions thereof are too numerous to mention specifically, the variations thereof can be understood to those skilled in the art from the teachings of the disclosure herein.

What is claimed is:

1. A clock signal generation circuit comprising:
   a clock inversion unit configured to invert a reference clock signal and an internal clock signal to generate an inverted reference clock signal and an inverted internal clock signal;
   a first clock detection unit configured to compare the reference clock signal with the internal clock signal to output a first detection signal;
   a second clock detection unit configured to compare the inverted reference clock signal with the inverted internal clock signal to output a second detection signal;
   a first charge pump unit configured to generate a first control voltage signal in response to the first detection signal;
   a second charge pump unit configured to generate a second control voltage signal in response to the second detection signal and the first control voltage signal; and
   an internal clock signal output unit configured to produce the internal clock signal according to the second control voltage signal.

2. The clock signal generation circuit of claim 1, wherein the first and second charge pump units receive the first control voltage signal as a bias voltage.

3. The clock signal generation circuit of claim 1, further comprising:
   a control voltage generator configured to generate the first and second control voltage signals based on charge current or discharge current generated by the first and second charge pump units.

4. The clock signal generation circuit of claim 1, wherein the first clock detection unit operates in response to rising edges of the reference clock signal and the internal clock signal; and the second clock detection unit operates in response to rising edges of the inverted reference clock signal and the inverted internal clock signal.

5. The clock signal generation circuit of claim 1, wherein the first clock detection unit, the first charge pump unit, and the internal clock signal output unit form a first loop, and the clock inversion unit, the second clock detection unit, the second charge pump unit, and the internal clock signal output unit form a second loop.

6. The clock signal generation circuit of claim 1, wherein the internal clock signal output unit controls a frequency of the internal clock signal according to the second control voltage signal.

7. The clock signal generation circuit of claim 1, wherein the internal clock signal output unit comprises a clock division unit configured to divide a phase locked loop signal to generate the internal clock signal.

8. The clock signal generation circuit of claim 7, wherein the first clock detection unit outputs the first detection signal by comparing phase/frequency of the reference clock signal with that of the internal clock signal.

9. The clock signal generation circuit of claim 1, wherein the internal clock signal output unit produces the internal clock signal by delaying the reference clock signal by a delay amount corresponding to the voltage level of the second control voltage signal.

10. The clock signal generation circuit of claim 1, wherein the clock inversion unit comprises:
    a first inverter configured to invert the reference clock signal to output the inverted reference clock signal to the second clock detection unit; and
    a second inverter configured to invert the internal clock signal to output the inverted internal clock signal to the second clock detection unit.

11. The clock signal generation circuit of claim 1, further comprising:
    an amplification unit configured to buffer the first control voltage signal to generate the second control voltage signal.

12. The clock signal generation circuit of claim 11, wherein the amplification unit comprises a unit gain buffer.

13. The clock signal generation circuit of claim 11, wherein the first clock detection unit, the first charge pump unit, the amplification unit, and the internal clock signal output unit form a first loop, and the clock inversion unit, the second clock detection unit, the second charge pump unit, and the internal clock signal output unit form a second loop.

14. The clock signal generation circuit of claim 1, wherein the first detection signal comprises a first up-detection signal and a first down-detection signal, and the second detection signal comprises a second up-detection signal and a second down-detection signal.

15. The clock signal generation circuit of claim 14, wherein the first up-detection signal and the first down-detection signal have different pulse widths, and the second up-detection signal and the second down-detection signal have different pulse widths.

* * * * *

UNITED STATES PATENT AND TRADEMARK OFFICE
CERTIFICATE OF CORRECTION

PATENT NO. : 8,358,160 B2  
APPLICATION NO. : 13/017270  
DATED : January 22, 2013  
INVENTOR(S) : Kwan-Dong Kim Page 1 of 1

It is certified that error appears in the above-identified patent and that said Letters Patent is hereby corrected as shown below:

Title Page, Item (56) change the FOREIGN PATENT DOCUMENTS section as follows:

KR    1020090070793    07/2009

Signed and Sealed this
Twelfth Day of March, 2013

Teresa Stanek Rea
*Acting Director of the United States Patent and Trademark Office*